United States Patent [19]

Wu et al.

[11] Patent Number: 4,877,644
[45] Date of Patent: Oct. 31, 1989

[54] SELECTIVE PLATING BY LASER ABLATION

[75] Inventors: Jeff C. Wu, Clemmons; Richard T. Williams, Winston-Salem; John R. Rowlette, Clemmons; Charles P. Brooks, Winston-Salem, all of N.C.; Richard H. Zimmerman, Bradenton, Fla.

[73] Assignee: AMP Incorporated, Harrisburg, Pa.

[21] Appl. No.: 180,417

[22] Filed: Apr. 12, 1988

[51] Int. Cl.[4] .............................................. B05D 3/06
[52] U.S. Cl. .................................... 427/53.1; 430/945; 204/29
[58] Field of Search ............... 427/53.1; 156/643, 630, 156/632; 204/29, 37.6; 430/321, 945

[56] References Cited

U.S. PATENT DOCUMENTS

| | | | |
|---|---|---|---|
| 4,348,263 | 9/1982 | Draper et al. | 204/29 |
| 4,414,059 | 11/1983 | Blum et al. | 427/53.1 |
| 4,432,855 | 2/1984 | Romankiw et al. | |
| 4,671,848 | 6/1987 | Miller et al. | 156/643 |
| 4,780,177 | 10/1988 | Wojnarowski et al. | 427/53.1 |

OTHER PUBLICATIONS

R. Srinivasan et al. JVST, B1, 923.
Gold Bulletin 1986, 19, "Laser Surface Alloying of Gold", C. W. Draper, pp. 8-14.
Journal Applied Physics 59, Jun. 1986, "Excimer Laser Etching of Polymers", by V. Srinivasan et al., pp. 3861-3867.
Materials Research Society, vol. 72, 1986, "Laser Photoetching of Polymers" by H. S. Cole et al., pp. 241-245.
A reprint from the Proceedings of SPIE-The International Society of Optical Engineering, vol. 610, pp. 1-5 Scientific and Engineering Applications of Commercial Laser Devices, Jan. 21-24, 1986, "Commercial Excimer Lasers" by Herbert Pummer.
Elsevier Sequoia/Printed in the Netherlands, paper presented at the International Conference on Metallurigical Coatings, San Francisco, Calif., Apr. 6-10, 1981, "The Effect of Laser Surface Melting on Tin-Modified" by C. W. Draper et al.
Apr. 6-10, 1981, "The Effect of Laser Surface Melting on Tin-Modified" by C. W. Draper et al.

Primary Examiner—Norman Morgenstern
Assistant Examiner—Roy V. King
Attorney, Agent, or Firm—William B. Noll

[57] ABSTRACT

A method for the selective plating of a metal substrate on which a thin polymeric plating resist is first applied, followed by the selective removal of said resist to expose portions of said substrate to plating, and plating. More particularly, the method hereof includes the steps of selecting a laser wavelength which couples well to the metal substrate, choosing a polymer based plating resist having a low optical coefficient of absorption at said wavelength, curing said resist, subjecting selective areas of said resist to a single excimer laser shot, having a short wavelength, to cause ablative removal of the resist over the selective areas of said substrate, and subjecting said exposed portions of said substrate to metal plating.

12 Claims, 2 Drawing Sheets

SELECTIVE PLATING BY LASER ABLATION

FIELD OF THE INVENTION

This invention relates to a method for laser treating a resist covered metal substrate to effect the removal of such resist over an extended area of the substrate area, preferably by a single laser shot, on which said laser pulse is imaged.

BACKGROUND OF THE INVENTION

The present invention relates to a method to permit the selective plating of a metal substrate, such as an electrical contact. The selective plating thereof, such as by plating with a precious metal, is achieved herein by selectively removing a plating resist covering said substrate. Such removal is accomplished by matching or coupling the laser wavelength, preferably one operating in the U.V. range, such as an excimer laser, with the plating resist and metal substrate.

A preferred embodiment of this invention is the selective plating of electrical terminals. Typically, such terminals are stamped and formed from metal strip and are attached to a carrier strip which is useful for strip feeding the terminals through successive manufacturing operations. One necessary manufacturing operation involves plating; i.e., electroplating, the electrical contact surfaces of the strip fed terminals with precious metal or semi-precious metal, such as gold or alloys thereof. Such metals are characterized by good electrical conductivity and little or no formation of oxides that reduce said conductivity. Therefore these metals, when applied as plating, will improve conductivity of the terminals. However, the high cost of these metals has necessitated precision deposition on the contact surfaces of the terminals, and not on surfaces of the terminals on which plating is not necessary. The present invention achieves this result by a method not found nor reported on in the prior art.

Examples of conventional selective plating practices are found in U.S. Pat. Nos. 4,555,321 and 4,473,445 where such patents disclose apparatus for the continuous plating of surfaces of electrical terminals. Said apparatus includes a rotating mandrel for guiding said terminals through a plating solution.

Technology has advanced to the stage that laser beams have been employed to improve metal substrate surfaces for subsequent plating. In co-pending application Ser. No. 133,779, now U.S. Pat. No. 4,832,798 and owned by the assignee herein, a technique is taught whereby the porosity of a nickel plated substrate is significantly reduced by a laser beam to permit a reduction in the level of precious metal plating needed on such nickel to produce a good contact surface.

U.S. Pat. No. 4,348,263 to Draper et al and directed to a process for surface melting of a substrate prior to plating, teaches a method of making an electrical contact by the steps of applying a first protective layer to a substrate, subjecting said protective layer and a portion of said substrate to melting by means of an electron beam or laser prior to the deposition. A related work by Draper, published in the *Gold Bulletin*, 1986, 19, entitled "Laser Surface Alloying of Gold," contains an illustrated showing on the mechanism of laser surface alloying by the use of focused laser pulsing.

Reports have appeared in the literature regarding attempts at laser ablation of polymer coatings on metals, and regarding methods of multi-shot removal of polymer coatings on non-metals. R. Srinivasan et al, in the *JAP* 59, 3861 (1986) and *JVST*, B1, 923 (1983) describe, for example, the use of excimer laser wavelengths which are strongly absorbed directly in the polymer itself to achieve removal of polymer by chemical bond-breaking or heating to vaporization, or a combination of both. However, the authors found that polymer ablation occurs when the laser light is absorbed within about the first 0.2 micron or less of the polymer surface. Then only that polymer material within the characteristic absorption depth was removed. In order to remove a thicker polymer film, such as is necessary for most electroplating requirements, multiple laser shots would be required. The use of multiple shots is much less desirable than single shot removal. One problem associated with the method of Srinivasan et al, wherein the laser light is directly absorbed in the polymer, is that choosing a laser wavelength too strongly absorbed in the polymer necessarily implies a small absorption depth and small thickness removed. On the other hand, choosing a wavelength too weakly absorbed in the polymer precludes depositing sufficient energy per unit volume of polymer to achieve ablation. The compromise value between these extremes dictates that no more than about 0.3 micron per pulse can be removed in the *best* case. Cole et al, in *Mat. Res. Soc. Symp. Proc.* 72, 241 (1986), concur with Srinivasan et al in this finding. The above process represents the current state of the art on excimer laser ablation of polymers.

However, the above description ignores another serious factor which applies only to removal of films deposited on *metal* substrates. Such problem has not shown up in some of the work, such as by Srinivasan et al, because they were concerned with polymer films on semiconductors or insulators (or free-standing), or in other cases because the workers were not sensitive to a very thin residual polymer layer remaining after the attempted laser ablation. However, such residual layer is severely detrimental to electroplating.

In U.S. Pat. No. 4,671,848 to Miller et al, a method for the removal of a dielectric coating from a conductor, by means of a focused, high energy radiation source, is taught. More particularly, in said method a laser source is focused to a point above the coating which results in a plasma or ionized region being formed. As a consequence, the coating is removed in a preselected region on the underlying conductor. In other words, the laser ablation depends on absorption of laser light by ionized air or other plasma and transmission to the dielectric. A difficulty of this method is the ability to control and adjust the air breakdown so as to ensure there is no damage to the conductor, i.e. underlying substrate, and to achieve removal of the residual layer. Another difficulty is that only a small area corresponding to the tight focus region can be removed on each shot. Miller et al state that extended areas are to be abated by multiple shots while moving the workpiece, or the laser focus.

In the Miller investigation cited above, the reason for the residual layer is believed to be a fundamental boundary condition on electromagnetic waves outside a metal surface. It is known that as a result of such condition, there is a decrease of the transverse electric field to small values as the metal surface is approached, thus ensuring insufficient direct heating of the polymer immediately adjoining the metal. This effect is further aggravated by the heat-sinking effect of the cold metal substrate surface underlying the polymer. To compensate, if a polymer is selected to have a very high absorption coefficient at the high wavelength of the laser to combat this effect, only a thin layer comparable to the optical absorption depth is removed with a single laser shot. As a consequence, multiple shots are required.

The present invention avoids these and other difficulties by the unique selection or matching of parameters, namely an excimer laser, a compatible polymer and substrate adapted to the wavelength thereof. The manner such selection brings these features together will become apparent from a reading of the specification which follows.

SUMMARY OF THE INVENTION

Figure 1D:
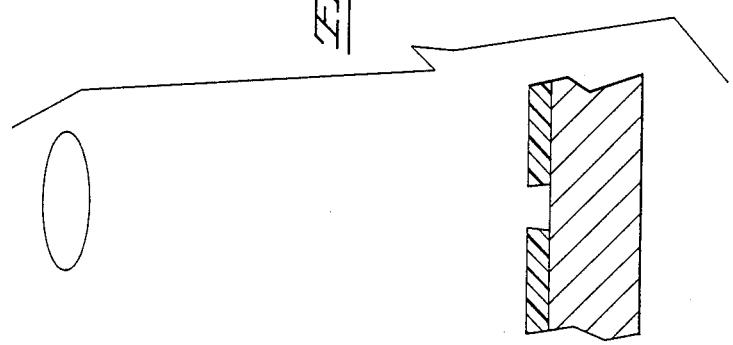
FIGS. 1A through 1D schematically illustrate the sequence resulting from the laser ablation of a polymer coating on a metal substrate.
Figure 1C:
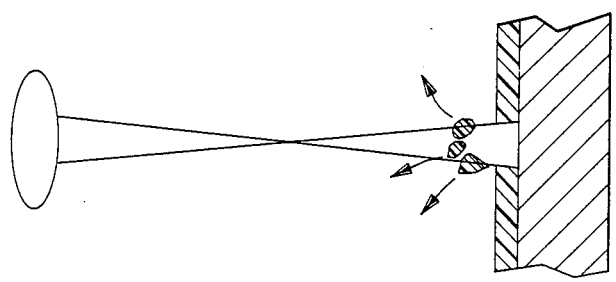
Figure 1B:
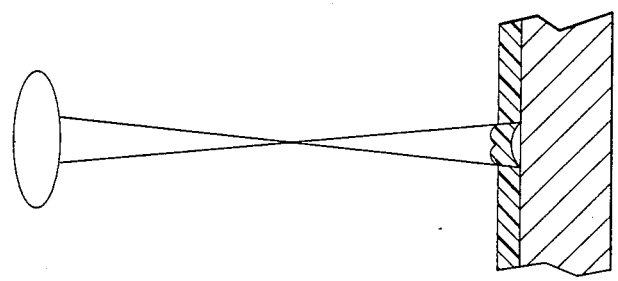
Figure 1A:
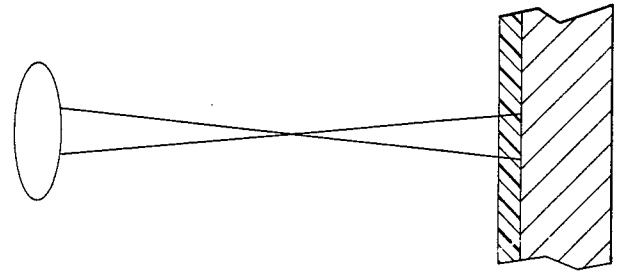

This invention is directed to a method for the selective plating of a metal substrate on which a thin polymeric plating resist is first applied, followed by the selective removal of said resist to expose portions of said substrate to plating, and plating. More particularly, the method hereof includes the steps of selecting a laser wavelength which is strongly absorbed by the metal substrate, i.e. reflectivity of less than about 70%, choosing a polymer based plating resist having a low optical coefficient of absorption to a laser wavelength, typically between about 248 to 360 nm, curing said resist, preferably subjecting selective areas of said resist to a single excimer laser shot, having a wavelength between about 248 to 360 nm, to heat the metal substrate and thereby cause ablative removal of the resist over the selective areas of said substrate, and subjecting said exposed portions of said substrate to metal plating.

DETAILED DESCRIPTION OF PREFERRED EMBODIMENT

The present invention is directed to a method for the selective plating of a metal substrate over which a plating resist, i.e. dielectric coating, has been placed. The selective plating is achieved by removing portions of such resist by directing a single excimer laser shot or optionally multiple shots, at the resist. By laser ablation, a selective portion of the resist is removed to expose a clean substrate suitable for plating.

In the field of laser applications there are several commercial units which operate at different wavelengths. For example, excimer lasers form a group of pulsed high-pressure gas lasers which emit various ultraviolet wavelengths, depending on the lasing medium, such as 193 nm, 248 nm, 308 nm and 351 nm. At the opposite end of the spectrum, operating in the infrared region are such lasers whose laser sources are carbon dioxide ($CO_2$), and neodymium doped yttrium-aluminum garnet (Nd:YAG). By way of example and comparison, typical wavelengths for the three commercial laser units are as follows:

Excimer 193, 248, 308, 351 nm
$CO_2$: 10,600 nm
ND:YAG 1,064 nm

The criticality of the proper selection of laser unit, by virtue of the precise wavelength range to which this invention relates, will become clearer from a further reading of these specifications.

It is fundamental to the success of the method hereof that the proper laser and wavelength range be coordinated with both the metal substrate and the plating resist or dielectric coating over the metal substrate to be plated. Since it is necessary that the laser energy be absorbed primarily at the metal substrate, the plating resist selected to practice this invention must have a low optical absorption coefficient, e.g. with absorption coefficient preferably no greater than about 1000 cm for a 3 micron film thickness. A suitable plating resist for use at laser wavelengths between, for instance about 300 to 360 nm, is a styrene acrylic copolymer, marketed under the designation WS5230, manufactured by Thiele-Engdahl. The optical absorption coefficient is wavelength related as illustrated in the following data of TABLE I.

TABLE I

| ABSORPTION COEFFICIENTS ($cm^{-1}$) Plating Resist Thickness | |
|---|---|
| Wavelength | Ave* |
| 351 nm | 666.5 |
| 308 nm | 725.1 |
| 248 nm | 7580.1 |

*Average of resist thickness between 73 and 209 μin.

In the ultraviolet region of wavelengths of 248 nm and less, the optical absorption coefficient of a typical polymer resist is quite high, see Table I, such that all energy of the laser beam is absorbed in the outermost layer, i.e. 0.5 microns, of the resist. If the resist is greater than about 0.5 microns, then multiple laser shots are required. Thus, there is a critical window of wavelengths which must be achieved to successfully ablate a plating resist in a single shot.

From the above, insofar as this invention is concerned, matching of the laser wavelength to the resist is critical. A further factor, equally important, for consideration herein is the reflective value of the metallic substrate, or its reflectivity. Reflectivity, is wavelength related. The data of TABLE II illustrates this relationship.

TABLE II

| Wavelength (microns) | SUBSTRATE REFLECTIVITY (%) | | |
|---|---|---|---|
| | Al | Cu | Ni |
| .25 | | | 47.5 |
| .26 | 92.2 | 35.5 | |
| .30 | | | 41.5 |
| .315 | 92.4 | 35.5 | |
| .36 | 92.5 | 41.5 | |
| 1.00 | 94.0 | 98.5 | 74 |
| 8.00 | | | 96 |
| 10.00 | 98.7 | 98.9 | |

From TABLE II, it is apparent that aluminum is a highly reflective metal surface over a broad range of wavelengths. With such high reflectance, only a limited amount of energy is absorbed by the aluminum, an amount insufficient to effect ablation of a plating resist thereover in accordance with this invention. In contrast, both copper and nickel reveal reflectivity values within a 35 to 50% range for the lower wavelengths, values which are well suited to practice this invention. For reasonable efficiency, the metal substrate should reflect no more than about 70%, i.e. absorbing 30%. In such practice, it will be understood that the laser beam is primarily absorbed by the metal substrate which transmits energy to the overlying plating resist, primarily by conduction.

Nothing to this point has been said about the energy densities of the laser shots. It was discovered that additional benefits, such as to the plated substrate, can be gained with the proper control of energy density. To demonstrate such benefits, examination by optical microscopy and scanning electron microscopy were employed to study the surface changes of the ablated substrates, and to determine whether the ablated substrates were polished at various energy densities. Resist coated substrates were ablated by the laser with shots from 0.6 J/cm$^2$ to 3.0 J/cm$^2$. The resist was ablated completely by a single laser shot for energy densities greater than 0.90 J/cm$^2$. The ablated substrates were plated successfully either by immersion plating or electroplating, as hereinafter discussed. At an energy density of 0.6 J/cm$^2$, a small portion of the resist remained after ablation. SEM micrographs, as well as optical micrographs of the samples ablated between 0.90 J/cm$^2$ and 2.5 J/cm$^2$, did not show significant surface changes from a control sample. In other words, polishing was not observed at these energy densities. Thus, a large processing window versus energy density exists for complete ablation by a single laser shot. Further, at a higher energy density (3.0 J/cm$^2$), or multiple shots, polishing of the nickel substrate was observed. And, with such polishing the quality of the plating, by reducing substrate porosity, was realized. To review, an energy density level of at least about 0.90 J/cm$^2$ is needed to achieve single shot ablation of the plating resist of 5.0 $\mu$in thickness. However, to affect the surface characteristics of the plated substrate, higher energy densities, on the order of about 2.5 J/cm$^2$, or higher, are required.

What initially was thought to be a factor, i.e. resist film thickness, in the laser ablation process of this invention, turned out to be a nonfactor. Polymer samples ranging from 120 microinches to 515 microinches in thickness were exposed to energy densities of 0.9, 1.8, and 3 J/cm$^2$. All thicknesses up to 13.1 microns, for energy densities in excess of 1.0 J/cm$^2$, were removed in a single shot at all three energy densities. To some degree, the removal went even better for the thick film. This process thus achieves single-shot removal of films more than twenty times the greatest thickness per shot removed by conventional ablation, such as described earlier by Srinivasan and Cole, and their co-workers.

With all the factors thus considered and brought together, there is one theory that has evolved therefrom. While it is believed this theory is broadly applicable to laser resist ablation, we nevertheless include the process parameters present for which this theory was formulated:

a) excimer laser, 351 nm wavelength
b) nickel plated substrate
c) polymer resist with low optical absorption It is theorized that most of the laser energy goes through the polymer resist to the nickel plated substrate. There, 55% is absorbed in roughly 30 nm of metal. For an energy density below about 1.8 J/cm$^2$, the nickel evidently remains below its melting point (1455° C.), but nevertheless transfers enough energy to a thin adjoining layer of polymer to vaporize it. This simultaneously destroys the bonding layer holding the polymer resist to the nickel, and supplies the expanding vapor needed to drive the remaining solid polymer away from the surface. For higher energy densities, the bonding layer is likewise destroyed. However, a superficial layer of nickel melts resulting in a reflowing of the nickel over the substrate. In brief, the removal of the resist is caused by a phenomenon occurring within rather than externally. FIGS. 1A through 1D schematically illustrate the sequence of laser resist ablation according to this invention.

Continuing with such Figures, a thin layer of polymer adjacent to the heated metal vaporizes and expands (FIG. 1B), and "blows off" (FIG. 1C) the outer layers of polymer without vaporizing them. In the progress of our investigation, we observed, photographed, and collected the solid film fragments so removed. By careful weighing, it was determined that only about 0.5% of the polymer film is vaporized, that being the layer nearest the metal. The remaining 99.5% is blown off in solid or melted form.

It was discovered that this method is immune to the problem described earlier with the electromagnetic boundary condition dictating small electric fields in the polymer adjacent to the metal and therefore leaving a residual layer. The method of this invention does not depend at all on the electric field within the polymer for energy absorption in the polymer, so the boundary condition (though still in force) has no detrimental effect. In point of fact, the severity of the boundary condition will have been reduced somewhat by the choice of a laser wavelength for which the metal is not highly reflective.

It has been demonstrated that in the preferred embodiment hereof, the polymer can be removed without any readily detectable alteration of the metal. Of course, if it is desired to melt the metal, such as for porosity reduction, this can be done in the same shot.

SPECIFIC EMBODIMENT

Figure 2:
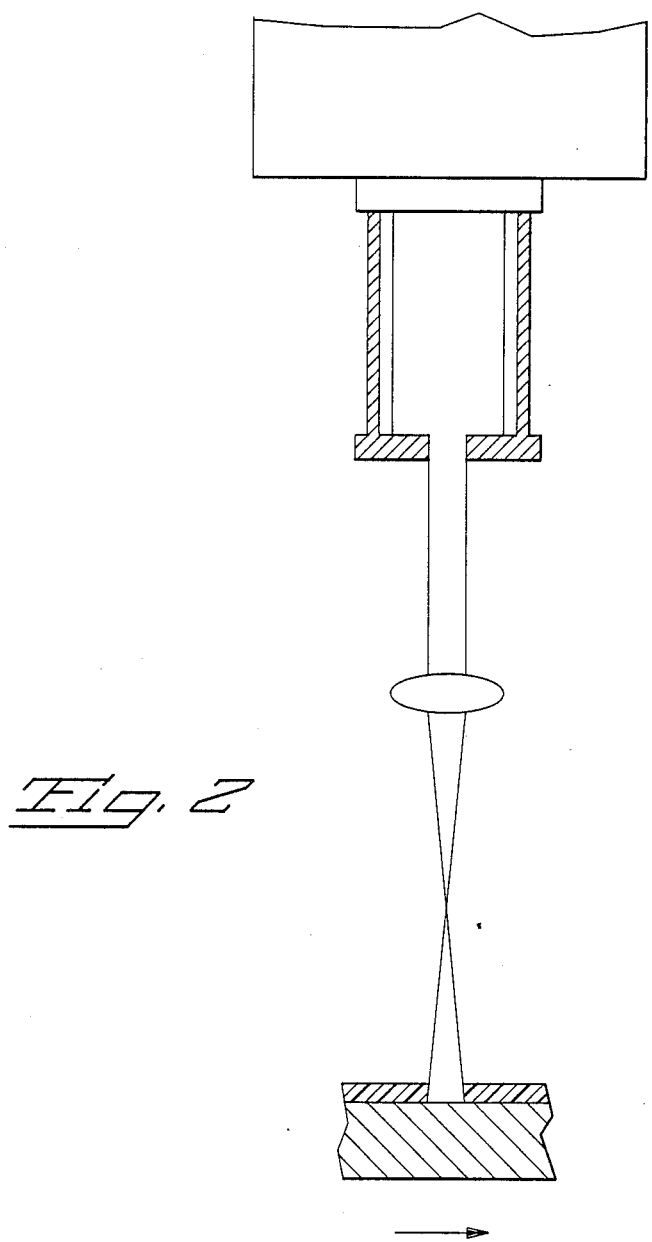
FIG. 2 is a schematic representation of a system for laser resist ablation according to this invention.

Nickel plated flat stock, and stamped electrical contacts were sprayed electrostatically with plating resists (WS5229 or WS5230), both of which have the same resin basis, an acrylic styrene co-polymer. The samples were dried in an infrared oven at about 275° F. for one minute. The dried samples had a nominal thickness of 150 microinches. However, as noted previously, the resist coating thickness is not a significant process variable. The sprayed and dried samples were ablated by the excimer laser* in a setup shown in FIG. 2. The ablated area was defined through an aperture and a lens. A transport mechanism was used to move the parts and ablate the parts continuously. Synchronization between the parts and the laser was obtained by adjusting the repetition rate of the laser and the transport speed, or by the use of an optical detector system.

*Laser parameters: $\lambda = 351$ nm pulse width = 10 nsec, energy density = 2 J/cm$^2$ repetition rate = 50H$_z$ Two plating techniques, i.e. immersion plating and electrolytic plating were used to provide the gold plated surfaces. Immersion plating is very sensitive to the surface cleanliness. For example, the presence of a thin organic coating such as residual polymer, which may result from incomplete ablation, will inhibit the ion exchange between the gold bath and the nickel surfaces and cause non plating. Samples ablated by the parameters above were activated in an M629 bath, an activation solution that removes the surface oxide prior to gold plating, for 15 seconds and immerse plated in a Technic Oromerse "N", a gold plating solution, for 90 seconds at about 80° C. All samples were plated and indicated the absence of the residual polymer. The results were confirmed by ESCA studies of the surface.

Electrolytic plating was used to obtain a thick nickel hardened gold plating for evaluation of the plating properties. To clean and activate the surface, plating substrates were first subjected to an activation bath. Thereafter, such substrates were electroplated in a bath having the following parameters:

| | |
|---|---|
| ° gold concentration | 2 tr. oz./gal |
| ° nickel concentration | 2100 ppm |
| ° pH | 4.6–4.8 |
| ° temperature | 120 F. |
| ° efficiency @ 40 ASF and 120 F. | 40–50% |

From such process, a gold deposit thickness of 30 $\mu$ was achieved in a dwell time of from 45 to 60 seconds.

We claim:

1. In a method for the selective plating of a metal substrate where a think polymeric plating resist is first applied to said substrate, followed by selective laser ablation of said resist to expose portions of said substrate to plating, the improvement comprising in combination therewith the steps of
    (a) correlating the operating parameters and character of said laser with said resist and said substrate,
        (i) selecting abating substrate having a low reflectance, at normal incidence of less than about 70%,
        (ii) selecting a polymer based plating resist for application to said substrate, including but not limited to said portions, and having an optical coefficient of absorption, no greater than about 1000 $cm^{-1}$ for a 3 micron film thickness,
        (iii) curing said resist on said substrate,
        (iiii) subjecting selective areas of said resist to and excimer laser shot, having a wavelength between about 248 to 360 nm, whereby a potion of the laser energy is transmitted through said resist to be absorbed by said substrate, resulting in said metal substrate being heated at the surface thereof to heat and vaporize the adjacent layer of said resist, said vaporized resist expanding causing the solid resist thereover to lift off exposing a clean metal substrate suitable for metal plating, and
    (b) subjecting said exposed portions of said substrate to metal plating.

2. The method according to claim 1 characterized in that the selective removal of said resist was achieved by a single laser shot having an energy density of at least 0.60 $J/cm^2$.

3. The method according to claim 2 characterized in that the energy density level is at least 0.90 $J/cm^2$.

4. The method according to claim 3 characterized in that the energy density range is about 0.90 to 2.5 $J/cm^2$.

5. The method according to claim 1 characterized in that at least a first said laser shot is at an energy density level greater than 2.5 $J/cm^2$ to effect a change in the surface characteristics of said exposed portions of said substrate.

6. The method according to claim 5 characterized in that said surface change consists of reducing the surface roughness by closing the pores thereof.

7. The method according to claim 5 characterized in that said surface change consists of cleaning the surface thereof.

8. The method according to claim 5 characterized in that said surface change consists in the polishing of said surface.

9. The method according to claim 1 characterized in that said polymeric coating is applied by a process selected from the group consisting of screening, spraying, dipping, printing and electroplating.

10. The method according to claim 10 characterized in that said resist is a styrene acrylic copolymer.

11. The method according to claim 1 characterized in that said plating substrate is selected from a group consisting of nickel, nickel alloys, copper and copper alloys.

12. In a method for preparing a metal substrate for plating on selective areas thereof, where a thin polymeric plating resist is first applied to said substrate followed by selective laser ablation of said resist to expose said areas of said substrate for plating, the improvement comprising in combination therewith the steps of
    correlating the operating parameters and character of said laser with said resist and said substrate,
        (i) selecting a plating substrate having a low reflectance, at normal incidence of less than about 70%,
        (ii) selecting a polymer based plating resist for application to said substrate, including but not limited to said areas, and having an optical coefficient of absorption, no greater than about 1000 $cm^{-1}$ for a 3 micron film thickness,
        (iii) subjecting said selective areas of the resist to an excimer laser shot, having a wavelength between about 248 to 360 nm, whereby a portion of the laser energy is transmitted through said resist to be absorbed by said substrate, resulting in said metal substrate being heated at the surface thereof to heat and vaporize the adjacent layer of said resist, said vaporized resist expanding causing the solid resist thereover to life off exposing a clean metal substrate suitable for metal plating.

* * * * *